US008566762B2

(12) United States Patent
Morimoto et al.

(10) Patent No.: US 8,566,762 B2
(45) Date of Patent: Oct. 22, 2013

(54) THREE-DIMENSIONAL INTEGRATED CIRCUIT DESIGN DEVICE, THREE-DIMENSIONAL INTEGRATED CIRCUIT DESIGN, METHOD, AND PROGRAM

(75) Inventors: Takashi Morimoto, Osaka (JP); Takashi Hashimoto, Fukuoka (JP)

(73) Assignee: Panasonic Corportion, Osaka (JP)

( * ) Notice: Subject to any disclaimer, the term of this patent is extended or adjusted under 35 U.S.C. 154(b) by 0 days.

(21) Appl. No.: 13/637,818

(22) PCT Filed: Feb. 17, 2012

(86) PCT No.: PCT/JP2012/001057
§ 371 (c)(1),
(2), (4) Date: Sep. 27, 2012

(87) PCT Pub. No.: WO2012/120792
PCT Pub. Date: Sep. 13, 2012

(65) Prior Publication Data
US 2013/0019214 A1    Jan. 17, 2013

(30) Foreign Application Priority Data

Mar. 9, 2011    (JP) .................................. 2011-052026

(51) Int. Cl.
*G06F 17/50*    (2006.01)

(52) U.S. Cl.
USPC ......................................................... 716/102

(58) Field of Classification Search
USPC ......................................................... 716/102
See application file for complete search history.

(56) References Cited

U.S. PATENT DOCUMENTS

| | | | | |
|---|---|---|---|---|
| 2009/0019411 A1* | 1/2009 | Chandra et al. | ................... | 716/9 |
| 2009/0024347 A1* | 1/2009 | Chandra et al. | ............... | 702/130 |
| 2012/0129301 A1* | 5/2012 | Or-Bach et al. | ............... | 438/129 |

FOREIGN PATENT DOCUMENTS

| | | |
|---|---|---|
| JP | 6-268067 | 9/1994 |
| JP | 2002-141471 | 5/2002 |

* cited by examiner

*Primary Examiner* — Vuthe Siek
*Assistant Examiner* — Mohammed Alam
(74) *Attorney, Agent, or Firm* — Wenderoth, Lind & Ponack, L.L.P.

(57) ABSTRACT

A worst-case temperature calculation unit calculates, based on heat value information of each layer of a three-dimensional integrated circuit to be designed and stack structure information of the three-dimensional integrated circuit, a worst-case temperature of a layer during operation that is targeted for logic synthesis. A logic synthesis library selection unit selects a library appropriate for the calculated worst-case temperature. A logic synthesis unit performs logic synthesis on the targeted layer with use of the selected library.

12 Claims, 20 Drawing Sheets

FIG. 4

Example of RTL description 301

```
module mc_dp_top(
          clk_dat
          ,clk_cmd
          ,rst_n
          ,mc_tsv_dp                      ⎫
          ,mc_tsv_valid                   ⎬ 401
          ,mc_uid
          ,mc_ctyp
          ,mc_valid
          );

//clock
input              clk_dat;      //Clock Signal
input              clk_cmd;      //Clock Signal
                                                        ⎫
//reset                                                 ⎬ 402
input              rst_n;        //Async. Reset Signal
input   [127:0]    c_tsv_dp;
input              mc_tsv_valid;
                       ⋮

TSVCELLI tsv_dp_0 (.in(mc_tsv_dp[0]), .out(dp[0]));   ⎫
TSVCELLI tsv_dp_1 (.in(mc_tsv_dp[1]), .out(dp[1]));   ⎬ 403
TSVCELLI tsv_dp_2 (.in(mc_tsv_dp[2]), .out(dp[2]));   ⎭
                       ⋮ assign mc_uid = 3{valid} & dp[3:1];                   ⎫
                                                      ⎬ 404
endmodule                                             ⎭
```

FIG. 5

Example of source voltage information 302

```
Vdda 3.3V mc_dp_top, mc_cont_top, dec_dp_top, dec_cont_top;
Vddio 1.8V mc_io_top, dec_io_top;

Example of synthesis constraints 304

```
create_clock -name clk100io -period $cycle_100 -waveform [list 0 $hcycle_100]

create_clock -name clk100io -period [expr $cycle_200 * 2] -waveform [list 0 $cycle_200]

create_clock -name clk200um -period $cycle_200 -waveform [list 0 $hcycle_200] [get_ports clk200um]

Example of thermal conductivity information 801

| | | |
|---|---|---|
| cooling; | Cu | 398 (w/mk) |
| mc_top; | Si | 168 (w/mk) |
| | Al | 236 (w/mk) |

Example of chip stack information 803

```
1st layer : cooling;          1 cm
2nd layer : mc_top;          10 μm
3rd layer : stream_top;      10 μm
4th layer : avio_top;        10 μm
5th layer : mem_con_glue;    20 μm
6th layer: Interposer        30 μm
7th layer: Board substrate    5 mm
                .
                .
                .
                .
```

FIG. 13A Cell library for logic synthesis
(appropriate for worst-case temperature of 120°C)                    1301

| Cell name | Area (the number of gates) | Delay duration (ns) | Leakage current (nW) | .... |
|---|---|---|---|---|
| INVD1 | 1 | 0.05 | 5 | .... |
| INVD4 | 4 | 0.03 | 30 | .... |
| . | . | . | . | .... |
| NAND2D1 | 2 | 0.07 | 7 | .... |
| NAND2D4 | 8 | 0.05 | 20 | .... |

FIG. 13B Cell library for logic synthesis
(appropriate for worst-case temperature of 100°C)                    1302

| Cell name | Area (the number of gates) | Delay duration (ns) | Leakage current (nW) | .... |
|---|---|---|---|---|
| INVD1 | 1 | 0.04 | 4 | .... |
| INVD4 | 4 | 0.02 | 25 | .... |
| . | . | . | . | .... |
| NAND2D1 | 2 | 0.06 | 6 | .... |
| NAND2D4 | 8 | 0.04 | 18 | .... |

FIG. 13C Cell library for logic synthesis
(appropriate for worst-case temperature of 80°C)                     1303

| Cell name | Area (the number of gates) | Delay duration (ns) | Leakage current (nW) | .... |
|---|---|---|---|---|
| INVD1 | 1 | 0.03 | 3 | .... |
| INVD4 | 4 | 0.01 | 20 | .... |
| . | . | . | . | .... |
| NAND2D1 | 2 | 0.05 | 5 | .... |
| NAND2D4 | 8 | 0.03 | 16 | .... |

FIG. 14

Example of netlist

```
module mc_dp_top(
            clk_dat
            ,clk_cmd
            ,rst_n
            ,mc_tsv_dp
            ,mc_tsv_valid
            ,mc_uid
            ,mc_ctyp
            ,mc_valid
        );
  //clock
  input              clk_dat;         //Clock Signal
  input              clk_cmd;         //Clock Signal //reset
  input              rst_n;           //Async. Reset Signal
  input    [127:0]   mc_tsv_dp;
  input              mc_tsv_valid;
              .
              .
              .
  TSVCELL1 tsv_dp_0 (.in(mc_tsv_dp[0]), .out(dp[0]));
  TSVCELL1 tsv_dp_1 (.in(mc_tsv_dp[1]), .out(dp[1]));
  TSVCELL1 tsv_dp_2 (.in(mc_tsv_dp[2]), .out(dp[2]));
              .
              .
  NAND2D1 m200 (.A(valid), .B(dp[3]), .Y(w200) ;
  NAND2D4 m201 (.A(valid), .B(dp[2]), .Y(w201) ;
  NAND2D1 m202 (.A(valid), .B(dp[1]), .Y(w202) ;
  INVD1 m203( .A(w200), .Y(mc_uid[2]);
  INVD1 m204( .A(w201), .Y(mc_uid[1]);
  INVD1 m205( .A(w202), .Y(mc_uid[0]);
endmodule
```

1401

FIG. 15A Logic synthesis with use of library appropriate for 120°C
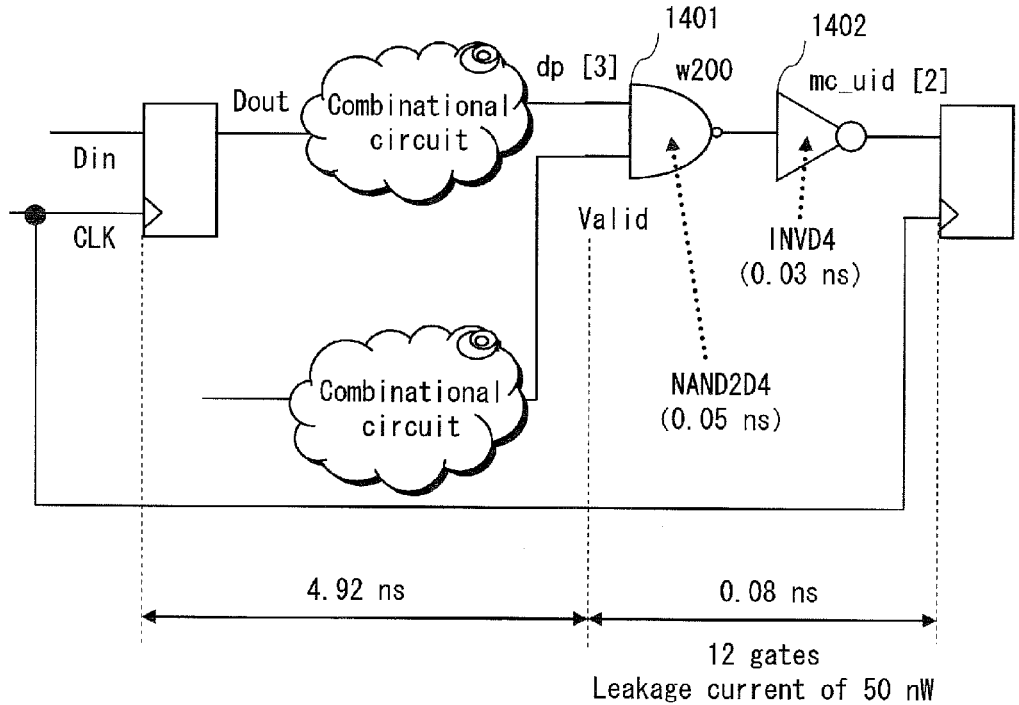
FIG. 15B Logic synthesis with use of library appropriate for 80°C
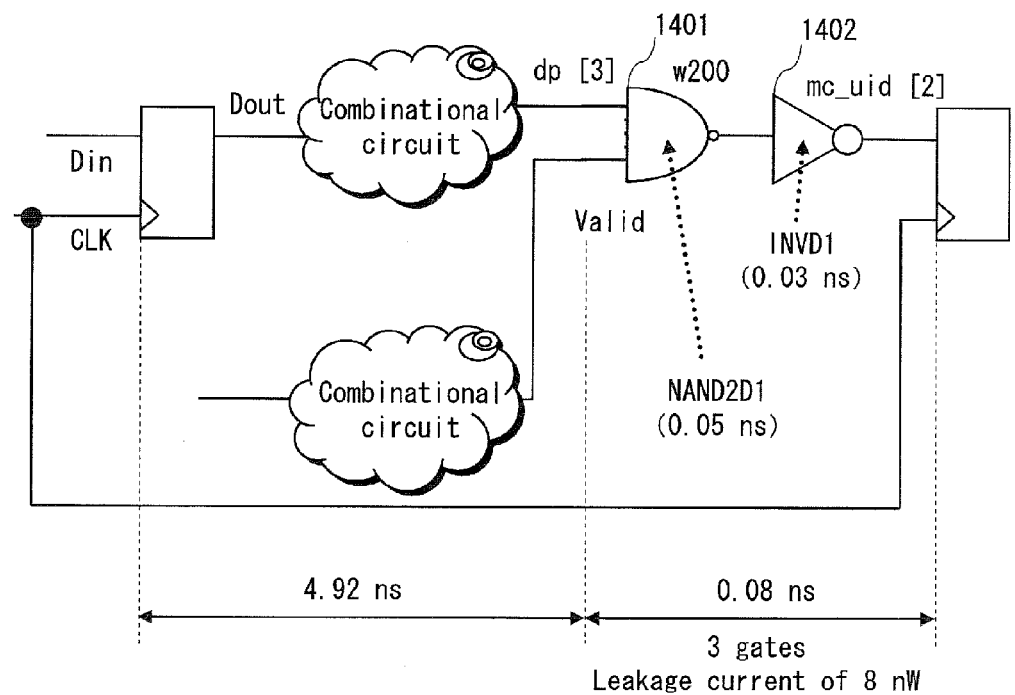

FIG. 18

Example of circuit type information

| Module name | Type |
|---|---|
| mc_cpu | Processor |
| mc_L1c | Memory |
| mc_L2c | Memory |
| mc_dec | Decoder core |

Example of heat value table

| Type | Scale | | Heat value |
|---|---|---|---|
| Processor | 100000 Tr. | ··· | 100000 |
| Processor | 200000 Tr. | ··· | 150000 |
| Memory | 100000 Tr. | ··· | 200000 |

⋮

# THREE-DIMENSIONAL INTEGRATED CIRCUIT DESIGN DEVICE, THREE-DIMENSIONAL INTEGRATED CIRCUIT DESIGN, METHOD, AND PROGRAM

BACKGROUND OF INVENTION

1. Technical Field

The present invention relates to an art of designing a three-dimensional integrated circuit, and particularly to an art of designing a three-dimensional integrated circuit in consideration of heat generated within the three-dimensional integrated circuit.

2. Background Art

A three-dimensional integrated circuit has properties that heat is hard to be externally dissipated, compared to a two-dimensional integrated circuit. This makes important to design a three-dimensional integrated circuit in consideration of heat generated within the three-dimensional integrated circuit. For example, there has been known an art of making a circuit layout in the mask layout design phase such that each two vertically stacked chips do not have respective heat generating portions in the corresponding position (see Non-Patent Literature 1).

Also, it is preferable, in a phase prior to the logic synthesis phase, to start such a design as explained above in consideration of heat generated within the three-dimensional integrated circuit. This is in order to reduce repetition of the logic synthesis process and the layout process. In the logic synthesis phase, logic synthesis is performed so as to ensure the operations of the circuit even under assumed conditions in the case where the operating speed is the lowest (worst case), such as even under operating temperature conditions on the entire circuit in the worst case. Here, if the circuit operates under operating temperature conditions better than the assumed operating temperature conditions, an unnecessary performance of the circuit is used. This leads to the consumption of much power and the necessity of a larger area on which the circuit is to be mounted. Such a large performance margin is not preferable in terms of power consumption and size reduction of integrated circuit. In order to avoid such a large performance margin, Patent Literature 1 discloses an art of decreasing a performance margin. Specifically, an integrated circuit includes a plurality of cells that satisfy respective operating conditions, and detects an actual operating temperature of each chip or the entire circuit to switch to a cell that satisfies operating conditions appropriate for the detected operating temperature.

CITATION LIST

Patent Literature

[Patent Literature 1] Japanese Patent Application Publication No. 2002-141471

Non-Patent Literature

[Non-Patent Literature 1] Vasilis F. Pavlidis et al. "Three-Dimensional Integrated Circuit Design", Morgan Kaufmann Publishers

SUMMARY OF INVENTION

According to the art disclosed in the Patent Literature 1, switching between cells is performed depending on an actual operating temperature. This requires the same number of circuits as the conditions even if some of the circuits have the same functions with overlap. Also, it is necessary to prepare a circuit for detecting an actual operating temperature. In this way, the art disclosed in the Patent Literature 1 can decrease the margin in terms of power consumption. However, this art requires an area where the circuits having the same functions with overlap are to be mounted that is larger than a reduced area margin which results from selecting a cell appropriate for an actual operating temperature. This leads to the increase in area of the entire circuit.

Also, since a three-dimensional integrated circuit is constituted by stacked semiconductor silicon chips, a difference increases between an actual operating temperature of each chip and a worst-case temperature assumed for the entire three-dimensional integrated circuit. If logic synthesis is performed based on this worst-case temperature, a three-dimensional integrated circuit is designed with use of standard cells having an excessive drive capability. This results in design of a circuit having a large performance margin.

The present invention was made in view of the above problem, and aims to provide an integrated circuit design device capable of designing a three-dimensional integrated circuit that has a small performance margin in the logic synthesis phase.

In order to achieve the above aim, one aspect of the present invention is an integrated circuit design device that designs a three-dimensional integrated circuit with use of a standard cell library, the standard cell library being composed of a plurality of libraries that are each appropriate for a different temperature, the integrated circuit design device comprising: a temperature calculation unit operable to calculate, based on respective heat values and structure information pieces of respective chips forming layers constituting a three-dimensional integrated circuit to be designed, an operating temperature of a chip forming each of one or more target layers targeted for logic synthesis among the constituting layers; a standard cell library selection unit operable to, for each of the target layers, select one among the libraries based on the operating temperature of the chip forming the target layer calculated by the temperature calculation unit; and a logic synthesis unit operable to perform logic synthesis on each of the target layers with use of the library selected by the selection unit.

According to the present invention, an operating temperature is calculated with respect to a chip forming each of layers constituting a three-dimensional integrated circuit to be designed, in consideration of respective heat values of respective chips forming the layers and the stack structure of each chip such as the thickness of the chip. This makes it possible to set a worst-case temperature that is close to an actual operating temperature of the chip. Furthermore, with respect to a chip forming each layer, one library is selected appropriate for the worst-case temperature among a plurality of libraries included in a standard cell library, and logic synthesis is performed on each layer with use of the selected library. This enables design of a three-dimensional integrated circuit having a small performance margin in the logic synthesis phase.

BRIEF DESCRIPTION OF DRAWINGS

FIG. 4 shows an example of an RTL description 301.

FIG. 5 shows an example of source voltage information 302.

FIG. 6 shows an example of synthesis constraints 304.

FIG. 9 shows an example of thermal conductivity information 801.

FIG. 10 shows an example of chip stack information 803.

FIG. 13A to FIG. 13C each show an example of a library included in the standard cell library.

FIG. 14 shows an example of a netlist.

FIG. 15A and FIG. 15B each show an example of logic synthesis with use of a library appropriate for a worst-case temperature.

FIG. 18 shows an example of circuit type information.

FIG. 19 shows an example of a heat value table.

DETAILED DESCRIPTION OF INVENTION

The following explains embodiments of the present invention with reference to the drawings.

Embodiment 1

Figure 1:
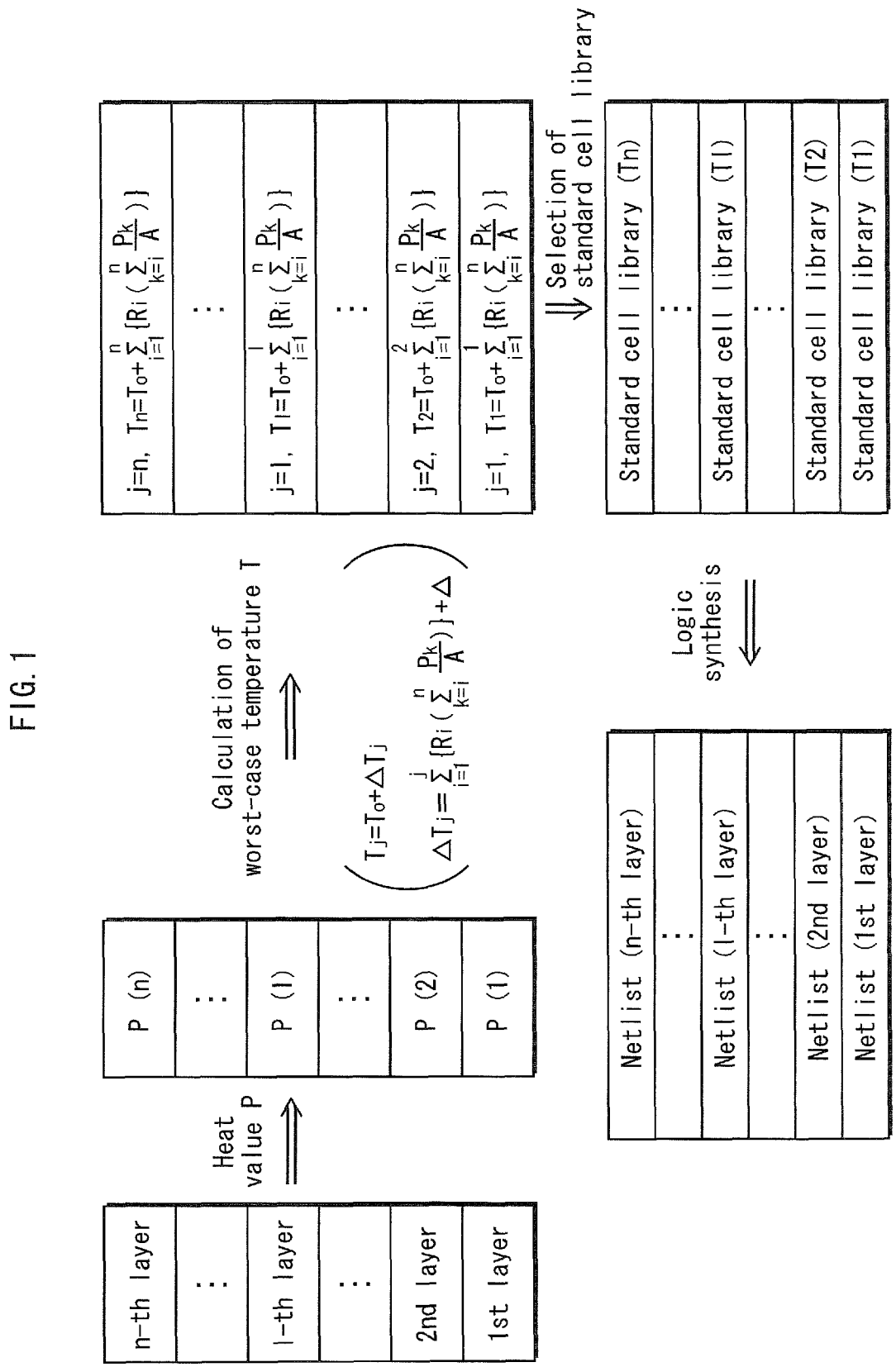
FIG. 1 shows the outline of processing by an integrated circuit design device relating to Embodiment 1.

An integrated circuit design device relating to Embodiment 1 is an integrated circuit design device that designs a three-dimensional integrated circuit with use of standard cells. FIG. 1 shows the outline of processing by the integrated circuit design device relating to the Embodiment 1.

As shown in FIG. 1, firstly, based on respective heat values P of respective chips forming layers constituting a three-dimensional integrated circuit to be designed, the integrated circuit design device calculates respective worst-case temperatures T of the respective chips forming the constituting layers. The respective heat values of the respective chips forming the constituting layers, which are for use in calculating the respective worst-case temperatures T, are each calculated based on an RTL description or the like, or is externally obtained from a data sheet or the like. In equations shown in FIG. 1 for calculating the worst-case temperature T of each chip, "$\Delta T$" represents a temperature variation of the chip, "$T_0$" represents an initial temperature of the chip, "R" represents a thermal resistance of the chip, "A" represents an area of the chip, and "$\Delta$" represents a margin value. The equations for calculating the worst-case temperature T shown in FIG. 1 are later explained.

After calculating the worst-case temperatures T of the chip forming each layer, the integrated circuit design device selects a library appropriate for the worst-case temperature T for each layer. Then, the integrated circuit design device performs logic synthesis with use of the selected library for each layer to generate a netlist for each layer.

In the logic synthesis phase in this way, the integrated circuit design device performs thermal analysis on the chip forming each layer, and calculates an operating temperature of the chip in consideration of a heat value of the layer and stack structure of the chip such as the thickness thereof. This makes it possible to set a worst-case temperature that is close to an actual operating temperature of the chip. A library appropriate for the worst-case temperature, which has been appropriately set, is selected to perform logic synthesis. This results in design of a three-dimensional integrated circuit having a small performance margin.

<Structure>

Figure 2:
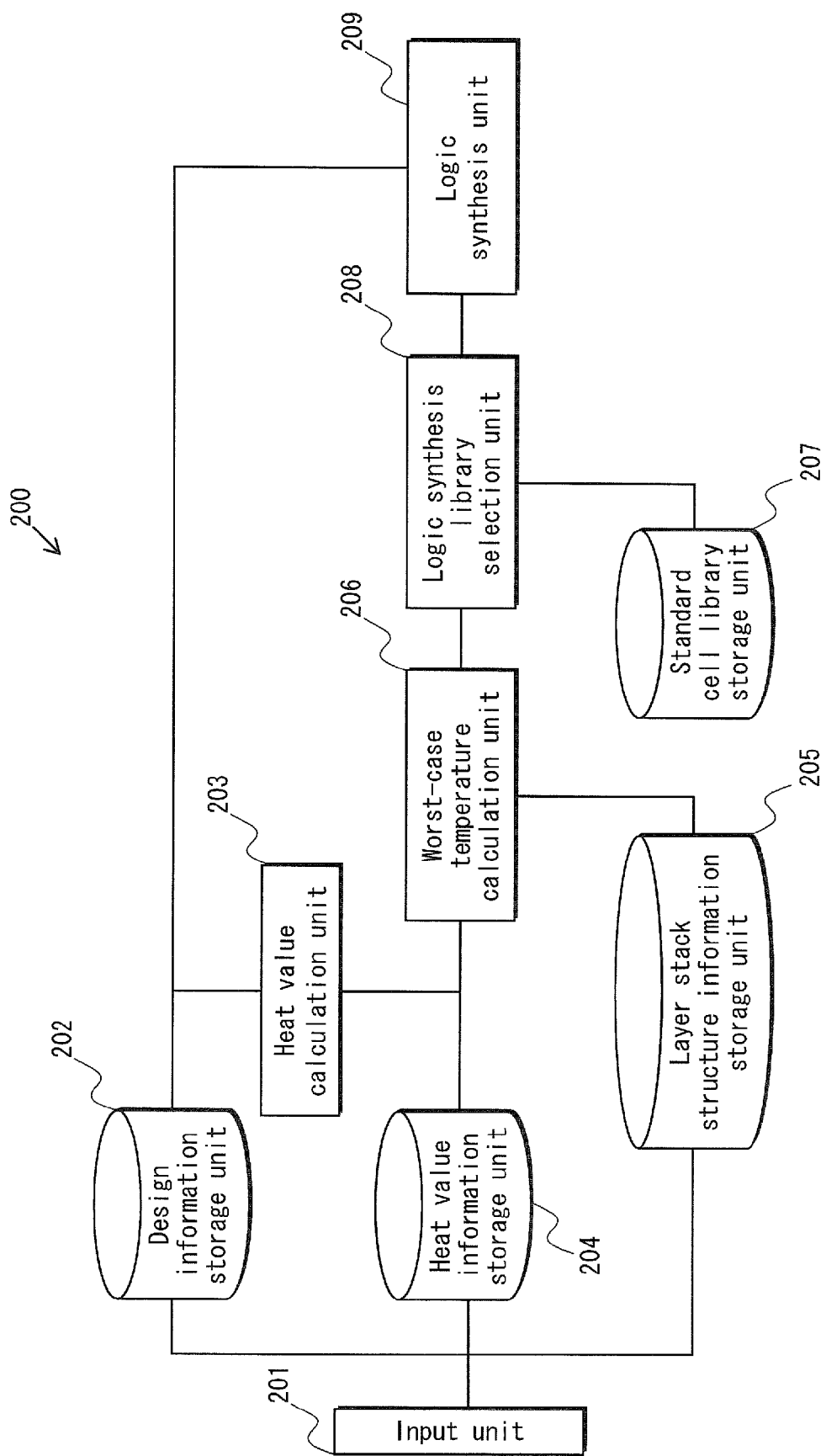
FIG. 2 is a block diagram showing an example of the structure of the integrated circuit design device relating to the Embodiment 1.

Firstly, the following explains the structure of an integrated circuit design device 200 relating to the Embodiment 1. FIG. 2 is a block diagram showing an example of the structure of the integrated circuit design device 200. As shown in FIG. 2, the integrated circuit design device 200 includes an input unit 201, a design information storage unit 202, a heat value calculation unit 203, a heat value information storage unit 204, a stack structure information storage unit 205, a worst-case temperature calculation unit 206, a standard cell library storage unit 207, a logic synthesis library selection unit 208, and a logic synthesis unit 209. These components are explained below separately.

<Input Unit 201>

The input unit 201 receives input of data to be used by the integrated circuit design device 200 for designing a three-dimensional integrated circuit. Specifically, the input unit 201 receives design information of a three-dimensional integrated circuit to be designed and stack structure information such as the thickness of each of layers constituting the three-dimensional integrated circuit. Also, in the case where the data sheet or the like beforehand indicates a heat value of a chip forming each of part or all of layers constituting the three-dimensional integrated circuit, the input unit 201 receives heat value information indicating a heat value of the chip forming each of the layers. The design information, the stack structure information, and the heat value information, which have been received by the input unit 201, are stored in the design information storage unit 202, the stack structure information storage unit 205, and the heat value information storage unit 204, respectively.

Note that the input unit 201 receives input of data via a keyboard, a mouse, a controller, or the like. Alternatively, the input unit 201 may read a data file from a storage medium that is externally connected with the integrated circuit design device 200.

<Design Information Storage Unit 202>

Figure 3:
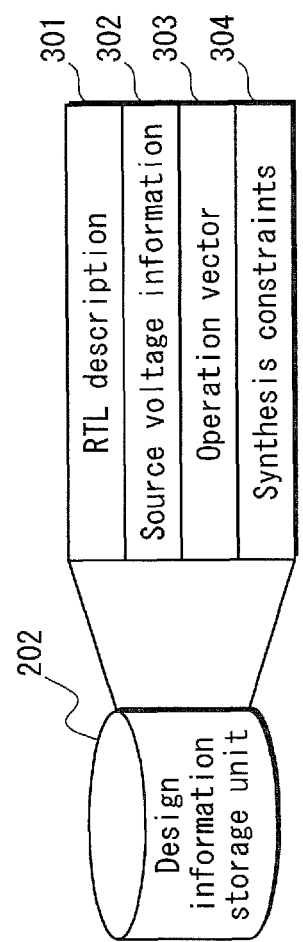
FIG. 3 is a pattern diagram showing the data structure of design information.

The design information storage unit 202 stores therein design information of a three-dimensional integrated circuit to be designed. The design information is for use in heat value calculation and logic synthesis which are later explained. FIG. 3 is a pattern diagram showing the data structure of the design information stored in the design information storage unit 202. As shown in FIG. 3, the design information includes, for example, an RTL description 301, source voltage information 302, an operation vector 303, and synthesis constraints 304. The RTL description 301 is a description at the RTL of the three-dimensional integrated circuit. The source voltage information 302 indicates a value of a source voltage to be supplied to each of modules of the three-dimensional integrated circuit. The operation vector 303 is an input signal for operating a chip forming each of layers constituting the three-dimensional integrated circuit, and is used as a test vector in RTL simulations which are later explained. The synthesis constraints 304 indicate constraint conditions for logic synthesis on chip area, delay duration, power consumption, and so on. The design information explained above is input by a circuit designer via the input unit 201. The following specifically explains the design information, taking an example of each information piece included in the synthesis constraints 304.

Firstly, the RTL description 301 is explained. FIG. 4 shows an example of the RTL description 301. In FIG. 4, numeral reference 401 represents definition of module names and a list of ports. Numeral reference 402 represents declaration of ports to be input. Numeral reference 403 represents connection between modules. Numeral reference 404 represents continuous assignment of signals to a port "mc_uid". In this way, the RTL description 301 describes the flow of signals between registers.

Next, the source voltage information 302 is explained. FIG. 5 shows an example of the source voltage information 302. As shown in FIG. 5, the source voltage information 302 includes a label name of a power source (such as "Vdda" and "Vddio"), a value of a source voltage (of such as 3.3 V and 1.8 V), a name of a module (such as "mc_dp_top" and "mc_io_top") driven at a source voltage, and so on. That is, the source voltage information 302 indicates a source voltage to be supplied to each of the modules of the three-dimensional integrated circuit. According to the example shown in FIG. 5, a module having a name "mc_dp_top" is driven at a voltage of 3.3 V, for example.

Finally, the synthesis constraints 304 are explained. FIG. 6 shows an example of the synthesis constraints 304. The synthesis constraints 304 indicate constraint conditions for logic synthesis on chip area, delay duration, power consumption, and so on. According to the example shown in FIG. 6, synthesis constraints of a frequency of 200 MHz are imposed on a clock port "clk200um". This means the necessity of limitation of a delay duration between registers connected with the clock port "clk200um" to 5 ns or less. This completes the explanation on the design information storage unit 202. The following explains the heat value calculation unit 203.

<Heat Value Calculation Unit 203>

The heat value calculation unit 203 calculates, as a heat value of a chip forming each layer, power consumption of the chip based on the design information. With respect to a layer whose heat value information has not been received by the input unit 201, the heat value calculation unit 203 calculates a heat value of a chip forming the layer. The following specifically explains heat value calculation of a chip forming each layer.

The power consumption of the chip is the sum of dynamic power consumption due to switching between transistors and static power consumption due to a leakage current while the transistors are not operating. While the dynamic power consumption is proportional to both the number of gates N and a toggle rate TR, the static power consumption is proportional to the number of gates N. Accordingly, the heat value calculation unit 203 analyzes the RTL description 301 to calculate the number of gates N. Also, the heat value calculation unit 203 calculates the toggle rate TR based on the RTL description 301 and the operation vector 303.

Firstly, explanation is given on a method of calculating dynamic power consumption. The dynamic power consumption includes power consumption due to current necessary for charging the load capacity (switching current) and power consumption due to current flowing from the power source to the ground (flow-through current). The heat value calculation unit 203 calculates, as dynamic power consumption, power consumption due to the switching current.

The power consumption due to the switching current is a result obtained by multiplying a square of a source voltage V by a load capacity C, the toggle rate TR, and the number of gates N. Here, the toggle rate TR indicates the number of switching operations per unit time. The source voltage V is obtained as the source voltage information 302 input by the circuit designer. The load capacity C is obtained as empirical or statistical data.

The toggle rate TR and the number of gates N are each calculated by analyzing the RTL description 301. Specifically, the heat value calculation unit 203 performs structure conversion by converting the RTL description 301 into a gate-level circuit description. Namely, the value calculation unit 203 performs register estimation, state machine synthesis, and so on. The value calculation unit 203 calculates the number of gates based on the gate-level circuit description. Also, the heat value calculation unit 203 calculates the toggle rate TR by performing RTL simulations on the gate-level circuit description with use of the operation vector 303. The operation vector 303, which is for use in RTL simulations, is an operation pattern that results in the highest power consumption. In this way, the heat value calculation unit 203 calculates the toggle rate TR based on the RTL description 301 and the operation vector 303 to obtain dynamic power consumption.

Next, explanation is given on a method of calculating static power consumption. The static power consumption is a result obtained by multiplying power consumption due to the leakage current per gate by the number of gates N. The power consumption due to the leakage current per gate is determined in accordance with the source voltage V. As explained above, the source voltage V is obtained as the source voltage information 302 input by the circuit designer. Also, the number of gates N is calculated based on the gate-level circuit description, which results from converting the RTL description 301, as explained above. In this way, the heat value calculation unit 203 analyzes the RTL description 301 to calculate the number of gates N, thereby to obtain static power consumption. This completes the explanation on the heat value calculation unit 203.

<Heat Value Information Storage Unit 204>

Figure 7:
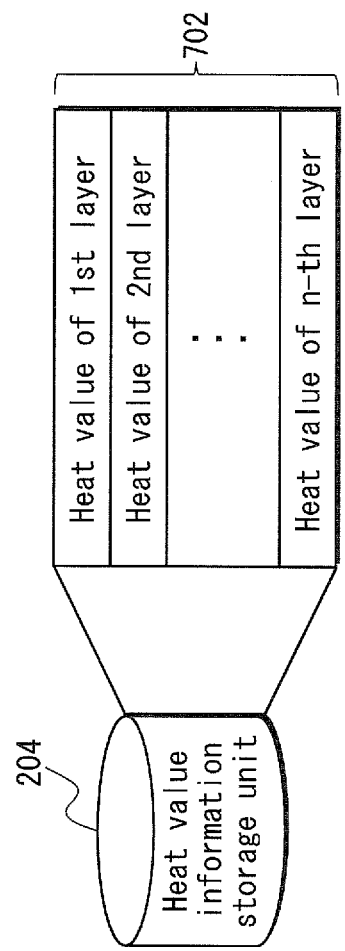
FIG. 7 is a pattern diagram showing the data structure of heat value information.

The design information storage unit 204 stores therein heat value information of each of layers constituting a three-dimensional integrated circuit to be designed. FIG. 7 is a pattern diagram showing the data structure of the heat value information. As shown in FIG. 7, the heat value information includes respective heat values 702 of respective chips forming layers constituting the three-dimensional integrated circuit.

The respective heat values of the respective chips forming the layers are each calculated by the heat value calculation unit 203 based on the RTL description or the like, or is externally obtained via the input unit 201 from the data sheet or the like.

<Stack Structure Information Storage Unit 205>

Figure 8:
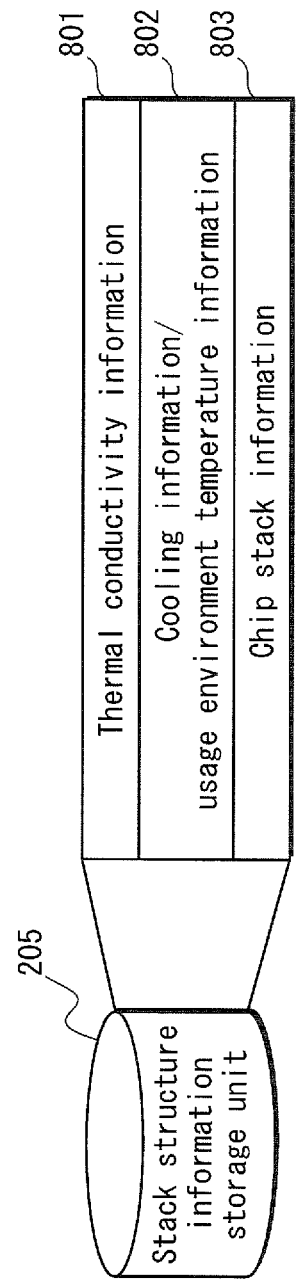
FIG. 8 is a pattern diagram showing the data structure of stack structure information.

The stack structure information storage unit 205 stores therein stack structure information of a three-dimensional integrated circuit to be designed, such as the respective thicknesses and thermal conductivities of respective chips forming layers constituting the three-dimensional integrated circuit. The stack structure information is used for worst-case temperature calculation. FIG. 8 is a pattern diagram showing the data structure of the stack structure information stored in the stack structure information storage unit 205. As shown in FIG. 8, the stack structure information includes, for example, thermal conductivity information 801, cooling information/usage environment temperature information 802, and chip stack information 803. The thermal conductivity information 801 indicates a value of a thermal conductivity of each of modules of the three-dimensional integrated circuit. The cooling information/usage environment temperature information 802 indicates a cooling solution and a usage environment temperature of the three-dimensional integrated circuit. The cooling information indicates a cooling solution such as the size of a heat sink. The usage environment temperature information indicates a usage environment temperature of the three-dimensional integrated circuit under a possible usage environment. The chip stack information 803 indicates the respective thicknesses of respective chips forming layers constituting the three-dimensional integrated circuit and respective names of modules constituting each of the chips. The stack structure information is input by the circuit designer via the input unit 201. The following specifically explains the stack structure information, taking an example of each information piece included in the stack structure information.

Firstly, the thermal conductivity information 801 is explained. FIG. 9 shows an example of the thermal conductivity information 801. As shown in FIG. 9, the thermal conductivity information 801 indicates a material (such as Cu and Si) constituting each of the modules of the three-dimensional integrated circuit to be designed and thermal conductivity of each of the materials. The thermal conductivity of each chip is calculated with reference to the thermal conductivity information 801.

Next, the chip stack information 803 is explained. FIG. 10 shows an example of the chip stack information 803. As shown in FIG. 10, the chip stack information 803 indicates respective names of modules constituting each of the respective chips forming layers and the respective thicknesses of the layers. According to the example shown in FIG. 10, a chip forming the second layer is composed of a module "mc_top", and the second layer has the thickness of 10 µm, for example. This completes the explanation on the stack structure information storage unit 205. Next, explanation is given on the worst-case temperature calculation unit 206.

<Worst-Case Temperature Calculation Unit 206>

The worst-case temperature calculation unit 206 calculates a thermal resistance R and a power density p of a chip forming each of layers constituting a three-dimensional integrated circuit to be designed, based on heat value information of respective heat values of the respective chips forming the constituting layers stored in the heat value information storage unit 204 and the stack structure information stored in the stack structure information storage unit 205. Then, based on the calculated thermal resistance R and power density p, the worst-case temperature calculation unit 206 calculates a worst-case temperature of the chip forming each layer.

In the case where the calculated worst-case temperature is higher than a temperature allowable in the system, a thermal-via is inserted. The thermal-via is a through-silicon via primarily intended to conduct heat between chips. The thermal-via conducts heat from a chip having a higher heat value to a chip having a lower heat value or to a chip close to the heat sink. In the case where the thermal-via is inserted, a worst-case temperature is calculated again. With respect to worst-case temperature calculation processing, the following explains "derivation of thermal resistance R" and "calculation of worst-case temperature" separately.

(Derivation of Thermal Resistance R)

Figure 11:
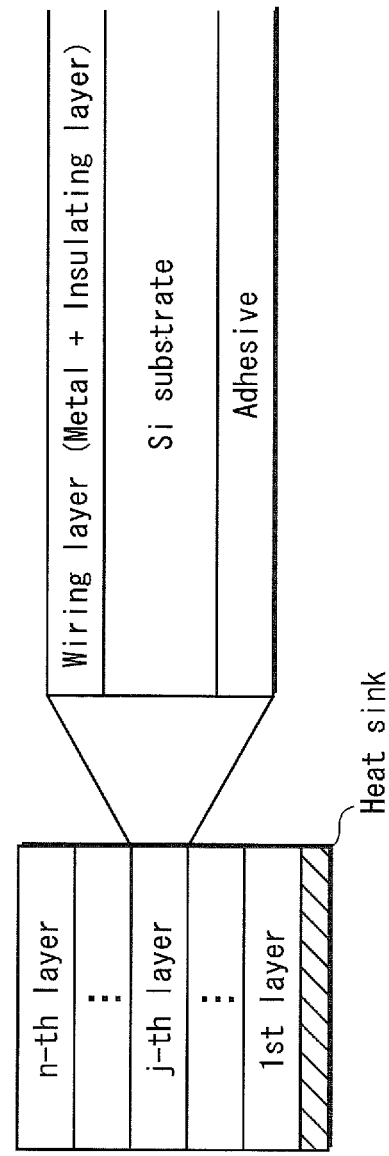
FIG. 11 shows the structure of a three-dimensional integrated circuit.

FIG. 11 shows the structure of a three-dimensional integrated circuit to be designed. A metal wiring layer is actually composed of a metal wiring layer and an insulating layer. For the purpose of simplification, a worst-case temperature is calculated with respect to the metal wiring layer and the insulating layer collectively as a single layer. The thermal resistance R is defined, for each layer, as a product of a reciprocal of thermal conductivity by the thickness. That is, the following relationship is satisfied: thermal resistance of j-th layer=(thickness of Si substrate of j-th layer÷thermal conductivity of Si substrate of j-th layer)+(thickness of wiring layer of j-th layer÷thermal conductivity of wiring layer of j-th layer)+(thickness of adhesive of j-th layer÷thermal conductivity of adhesive of j-th layer). Here, the thickness of the Si substrate and so on are indicated by the chip stack information 803. Also, the thermal conductivity of the Si substrate and so on are indicated by the thermal conductivity information 801. In the way as explained above, the worst-case temperature calculation unit 206 derives the thermal resistance R of each layer. Note that the thermal resistance of each layer differs depending on insertion of a thermal-via or the like. In the case where a thermal-via or the like is inserted, the worst-case temperature calculation unit 206 derives the thermal resistance R of each layer in consideration of a thermal resistance of the inserted thermal-via or the like. This completes the explanation on derivation of thermal resistance R. Next, calculation of worst-case temperature is explained.

(Calculation of Worst-Case Temperature)

The relationship among a thermal resistance R, a power density $\phi$, and a temperature rise $\Delta T$ is expressed by the following equation: $\Delta T = R \times \phi$. This equation is in accordance with the Ohm's law (voltage drop=electrical resistance×current). Temperature variation is calculated with use of an electrical circuit model in which a thermal resistance and a heat flow have been replaced with a resistance and a current source, respectively. Note that the power density $\phi$ represents power consumption per unit area, and is expressed by the following equation: $\phi = P \div A$, where P denotes power consumption of a chip forming each layer, and A denotes an area A of the chip. Accordingly, based on the above electrical circuit model in which the thermal resistance and the heat flow have been replaced with the resistance and the current source, respectively, the following equation results in temperature variation of the j-th layer of a three-dimensional integrated circuit constituted by n layers.

$$\Delta T_j = \sum_{i=1}^{j} \left[ R_i \left( \sum_{k=i}^{n} \frac{P_k}{A} \right) \right] + \Delta \qquad [\text{Equation 1}]$$

Where, R denotes a thermal resistance of the chip, P denotes power consumption of the chip, and A denotes an area of the chip. Also, $\Delta$ represents a margin which is empirically determined by the circuit designer.

The worst-case temperature calculation unit 206 obtains the power consumption P of the chip forming each layer from the heat value information, and calculates a temperature variation $\Delta T$ of the chip by the Equation 1. Then, the worst-case temperature calculation unit 206 adds up the calculated temperature variation $\Delta T$ to the usage environment temperature $T_0$ of the three-dimensional integrated circuit under a possible usage environment indicated by the cooling information/usage environment temperature information 802, thereby to obtain a worst-case temperature T. This completes the explanation on the worst-case temperature calculation unit 206. Next, explanation is given on the standard cell library storage unit 207.

<Standard Cell Library Storage Unit 207>

Figure 12:
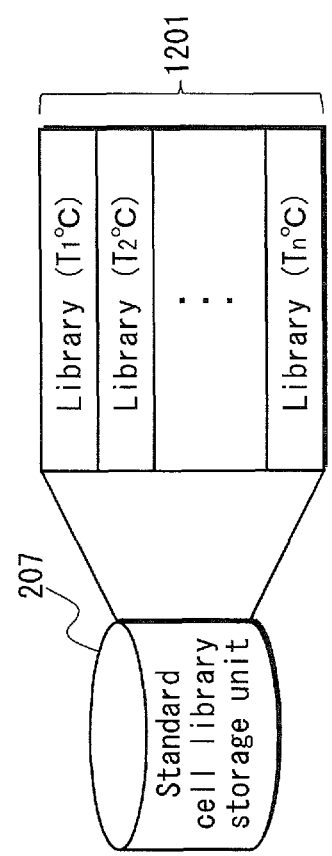
FIG. 12 shows the data structure of a standard cell library.

The standard cell library storage unit 207 stores therein a standard cell library. The standard cell library is a data base of standard cells for realizing various types of logic functions. FIG. 12 shows the data structure of the standard cell library.

As shown in FIG. 12, the standard cell library is composed of a plurality of libraries 1201 that are each appropriate for a different operating temperature, because the properties of each standard cell such as drive capability and power consumption differ depending on the operating temperature.

FIG. 13A to FIG. 13C each show an example of a library included in the standard cell library. FIG. 13A to FIG. 13C show libraries that are appropriate for a temperature of 120 degree Celsius, a temperature of 100 degree Celsius, and a temperature of 80 degree Celsius, respectively. With respect to each of the logic functions, the libraries each contain not just one type but a plurality of types of standard cells each having a different drive capability. In FIG. 13A to FIG. 13C, characters such as "D1" and "D4" included in a name of each of the cells represent a drive capability of the cell. A higher value in characters of a name of a cell indicates that the cell has a higher drive capability. For logic synthesis, an appropriate standard cell is selected from the library under the constraint conditions on the delay duration, the chip area, the power consumption, and so on, thereby to realize circuit optimization. This completes the explanation on the standard cell library storage unit 207. Next, explanation is given on the logic synthesis library selection unit 208.

<Logic Synthesis Library Selection Unit 208>

The logic synthesis library selection unit 208 selects one among the plurality of libraries included in the standard cell library for use in logic synthesis on a chip, based on the worst-case temperature calculated for the chip by the worst-case temperature calculation unit 206. The libraries differ from each other in appropriate operating temperature. The logic synthesis library selection unit 208 selects a library appropriate for a temperature that is closest to the worst-case temperature that is higher. Note that in the case where the capability of cells contained in the libraries deteriorates as the temperature decreases, the logic synthesis library selection unit 208 selects a library appropriate for a temperature that is closest to the worst-case temperature that is lower.

With respect to each layer, in the case where two or more layers including the layer among layers constituting the three-dimensional integrated circuit are formed by respective chips having the same circuit structure, the logic synthesis library selection unit 208 selects a logic synthesis library in consideration of the respective worst-case temperatures of the respective chips forming the two or more layers. Specifically, the logic synthesis library selection unit 208 makes a comparison in worst-case temperature between the two or more layers formed by the chips having the same circuit structure. The logic synthesis library selection unit 208 selects a library appropriate for a worst-temperature that is closer to the highest worst-case temperature between the two or more layers. This is in order to avoid that in the case where the two or more layers are formed by the chips having the same circuit structure, different logic synthesis is performed.

<Logic Synthesis Unit 209>

The logic synthesis unit 209 performs logic synthesis on each of the respective chips forming layers constituting the three-dimensional integrated circuit, with use of a library selected for the chip by the logic synthesis library selection unit 208. Specifically, under the constraint conditions on the chip area, the delay duration, and the power consumption that are indicated in the synthesis constraints 304, the logic synthesis unit 209 performs logic synthesis by replacing the RTL description 301 with a netlist that is composed of a combination of standard cells. The netlist indicates information on connection between terminals in the three-dimensional integrated circuit. FIG. 14 shows an example of the netlist. The netlist shown in FIG. 14 corresponds to the RTL description 301 shown in FIG. 4. In FIG. 14, numeral reference 1401 represents standard cells with which the continuous assignment of signals to the port "mc_uid" represented by the numeral reference 404 in FIG. 4 has been replaced.

In this way, the integrated circuit design device 200 calculates an operating temperature of a chip forming each layer, based on respective heat values of respective chips forming layers constituting a three-dimensional integrated circuit to be designed. Then, the integrated circuit design device 200 selects a library appropriate for the calculated operating temperature to perform logic synthesis on each layer. The following explains the technical significance of logic synthesis that is performed by calculating a worst-case temperature in consideration of respective heat values of respective chips forming layers and selecting a library appropriate for the calculated worst-case temperature.

FIG. 15A and FIG. 15B each show an example of logic synthesis with use of a library appropriate for a different worst-case temperature. FIG. 15A and FIG. 15B show examples of three-dimensional integrated circuits to be designed represented by two rows "NAND2D1 m200 (.A (valid), .B(dp[3]), .Y(w200));" and "INVD1 m203 (.A (w200), .Y(mc_uid[2]));" included in the netlist shown in FIG. 14, respectively. The synthesis constraints of a frequency of 200 MHz are imposed on the clock port "clk200um". For the purpose of simplification of explanation, in the case where a combinational circuit has a fixed delay value (of 4.92 ns), parts indicated by characters "NAND2" and "INV" each have a delay value of 0.08 ns. The logic synthesis unit 209 performs logic synthesis, by allocating standard cells such that the area and power consumption each decrease under the constraint conditions of a delay value of 0.08 ns. FIG. 15A shows an example of logic synthesis with use of the library appropriate for the temperature of 120 degree Celsius shown in FIG. 13A. In this case, under the constraint conditions of a delay value of 0.08 ns, the logic synthesis unit 209 allocates "NAND2" and "INV" each having a drive capability "D4". This results in that the number of gates is 12 and a leakage power is 50 nW. FIG. 15B shows an example of logic synthesis with use of the library appropriate for the temperature of 80 degree Celsius shown in FIG. 13C. In this case, under constraint conditions of a delay value of 0.08 ns, the logic synthesis unit 209 allocates "NAND2" and "INV" each having a drive capability "D1". This results in that the number of gates is three and a leakage power is 8 nW.

In this way, the number of gates and power consumption of a three-dimensional integrated circuit to be designed greatly varies depending on a worst-case temperature to be set. This makes it important to set a worst-case temperature as close as possible to an actual operating temperature. According to the structure of a two-dimensional integrated circuit, substantially a uniform temperature is observed in the entire circuit because of thermal equilibrium resulting from bonding a heat sink onto a planar surface, and this leads to a small difference between a worst-case temperature set for the entire circuit and the actual operating temperature. Compared with this, according to the structure of a three-dimensional integrated circuit, respective chips forming layers are each a heat source, and an actual operating temperature greatly differ between the layers. In view of this, the integrated circuit design device 200 relating to the present embodiment calculates a worst-case temperature in consideration of the respective heat values of the respective chips forming the layers. In this way, the integrated circuit design device 200 calculates a suitable worst-case temperature that is close to an actual operating temperature of a chip forming each layer, and selects a library appropriate for the calculated worst-case temperature to perform logic synthesis. This results in design of a three dimensional integrated circuit having a small performance margin. This completes the explanation on the structure of the integrated circuit design device 200. Next, explanation is given on the operations of the integrated circuit design device 200 having the above structure.

<Operations>

Figure 16:
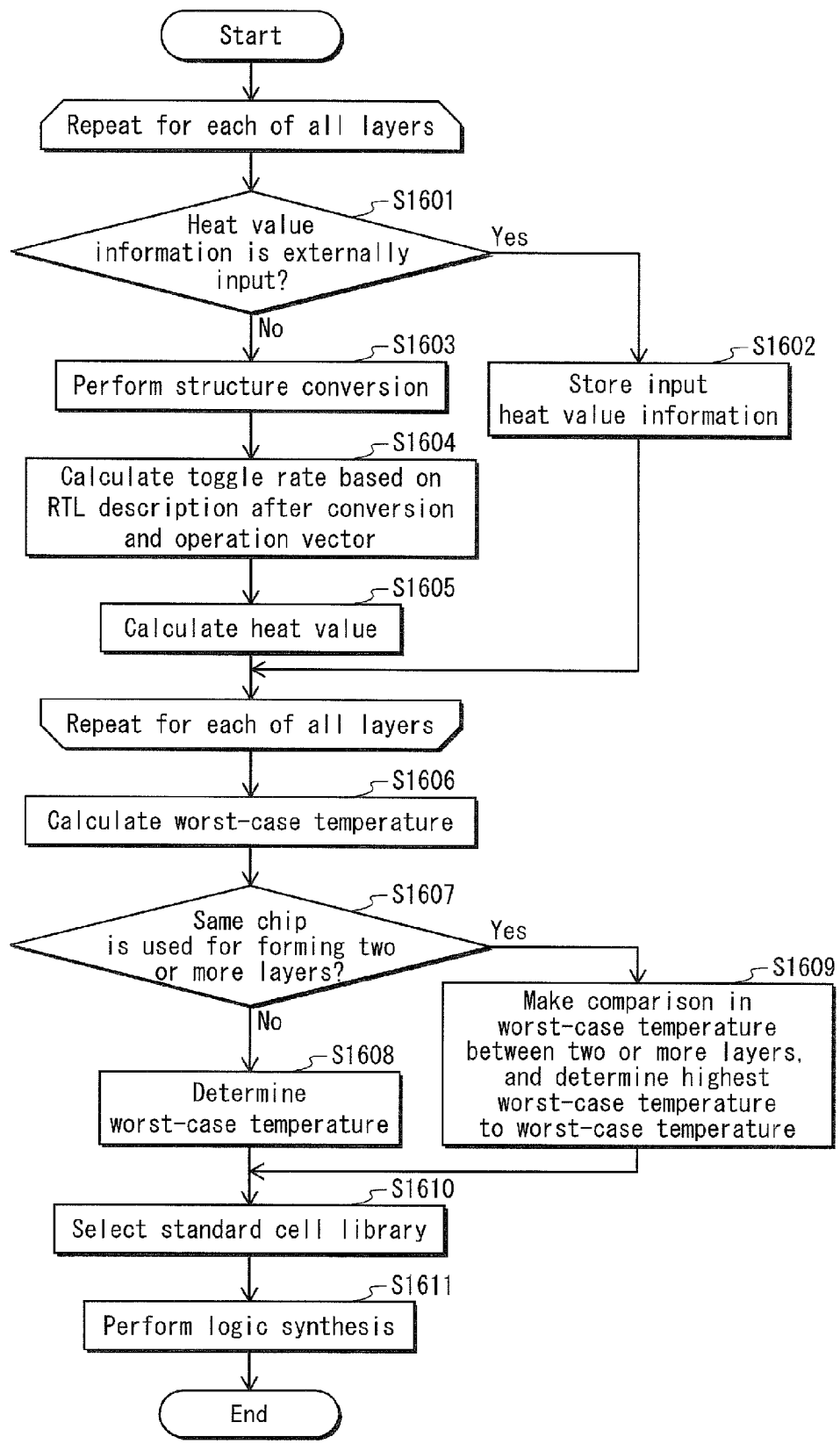
FIG. 16 is a flowchart showing operations of the integrated circuit design device relating to the Embodiment 1.

FIG. 16 is a flowchart showing the operations of the integrated circuit design device 200. As shown in FIG. 16, if heat value information is externally input via the input unit 201 (Step S1601: Yes), the heat value information storage unit 204 stores therein the input heat value information (Step S1602).

If no heat value information of any layer is externally input via the input unit 201 (Step S1601: No), the heat value calculation unit 203 calculates a heat value of the layer (Steps S1603 to S1605). Specifically, the heat value calculation unit 203 firstly performs structure conversion by converting the RTL description 301 into a gate-level circuit description. (Step S1603). Then, the heat value calculation unit 203 calculates a toggle rate based on the gate-level circuit description, which results from converting the RTL description 301, and an operation vector (Step S1604). That is, the heat value calculation unit 203 calculates the toggle rate by performing RTL simulations on the gate-level circuit description with use of the operation vector 303. Then, the heat value calculation unit 203 calculates a heat value of a chip forming the layer based on the toggle rate calculated in Step S1602, and stores the calculated heat value in the heat value information storage unit 204 (Step S1605). The integrated circuit design device 200 performs the heat value calculation processing in Steps S1601 to S1605 explained above on a chip forming each of all of the layers (the first layer to the n-th layer) of the three-dimensional integrated circuit.

After calculation of the respective heat values of all of the layers, the worst-case temperature calculation unit 206 calculates a worst-case temperature of a layer forming each of all of the layers, based on the heat value information of the layer stored in the heat value information storage unit 204 and the layer stack structure information (Step S1606).

With respect to each layer, the logic synthesis library selection unit 208 judges whether two or more layers including the layer among the layers constituting the three-dimensional integrated circuit are formed by respective chips having the same circuit structure (Step S1607). If judging that the two or more layers are not formed by the chips having the same circuit structure (Step S1607: No), the logic synthesis library selection unit 208 determines the temperature calculated in Step S1606 to a worst-case temperature for use in selecting a logic synthesis library for the layer (Step S1608). If judging that the two or more layers are formed by the chips having the same circuit structure (Step S1607: Yes), the logic synthesis library selection unit 208 makes a comparison in worst-case temperature between the two or more layers. The logic synthesis library selection unit 208 determines the highest worst-temperature between the two or more layers to a worst-case temperature for use in selecting a logic synthesis library for the layer (Step S1609). Then, the logic synthesis library selection unit 208 selects a library appropriate for the worst-case temperature, which is determined in Step S1608 or Step S1609 (Step S1610).

The logic synthesis unit 209 performs logic synthesis on a chip forming each of all of the layers with use of the library selected for the layer in Step S1610 (Step S1611). This results in obtaining a netlist for the chip forming each of all of the layers (the first layer to the n-th layer) of the three-dimensional integrated circuit. This completes the explanation on the operations of the integrated circuit design device 200.

According to the present embodiment as explained above, in the logic synthesis phase, the integrated circuit design device 200 calculates a heat value for each layer, calculates a worst-case temperature for a chip forming each layer, and selects a library for each layer based on the calculated worst-case temperature to perform logic synthesis on each layer. This makes it possible to set a worst-case temperature that is close to an actual operating temperature of the chip, thereby to design a three-dimensional integrated circuit having a small performance margin.

Embodiment 2

In the same way as the integrated circuit design device 200 relating to the Embodiment 1, in the logic synthesis phase, an integrated circuit design device relating to Embodiment 2 calculates a worst-case temperature of a chip forming each of layers constituting a three-dimensional integrated circuit to be designed based on a heat value of each layer, and selects a library for each layer based on the calculated worst-case temperature to perform logic synthesis on each layer. The integrated circuit design device relating to the Embodiment 2 differs from the integrated circuit design device 200 in method of calculating the heat value of each layer. The integrated circuit design device relating to the Embodiment 2 calculates a toggle rate based on an RTL description and synthesis constraints to obtain a heat value for each layer. This enables high-speed calculation of the heat value of each layer, without RTL simulations using an operation vector. The following specifically explains the difference from the Embodiment 1 in heat value calculation processing.

Figure 17:
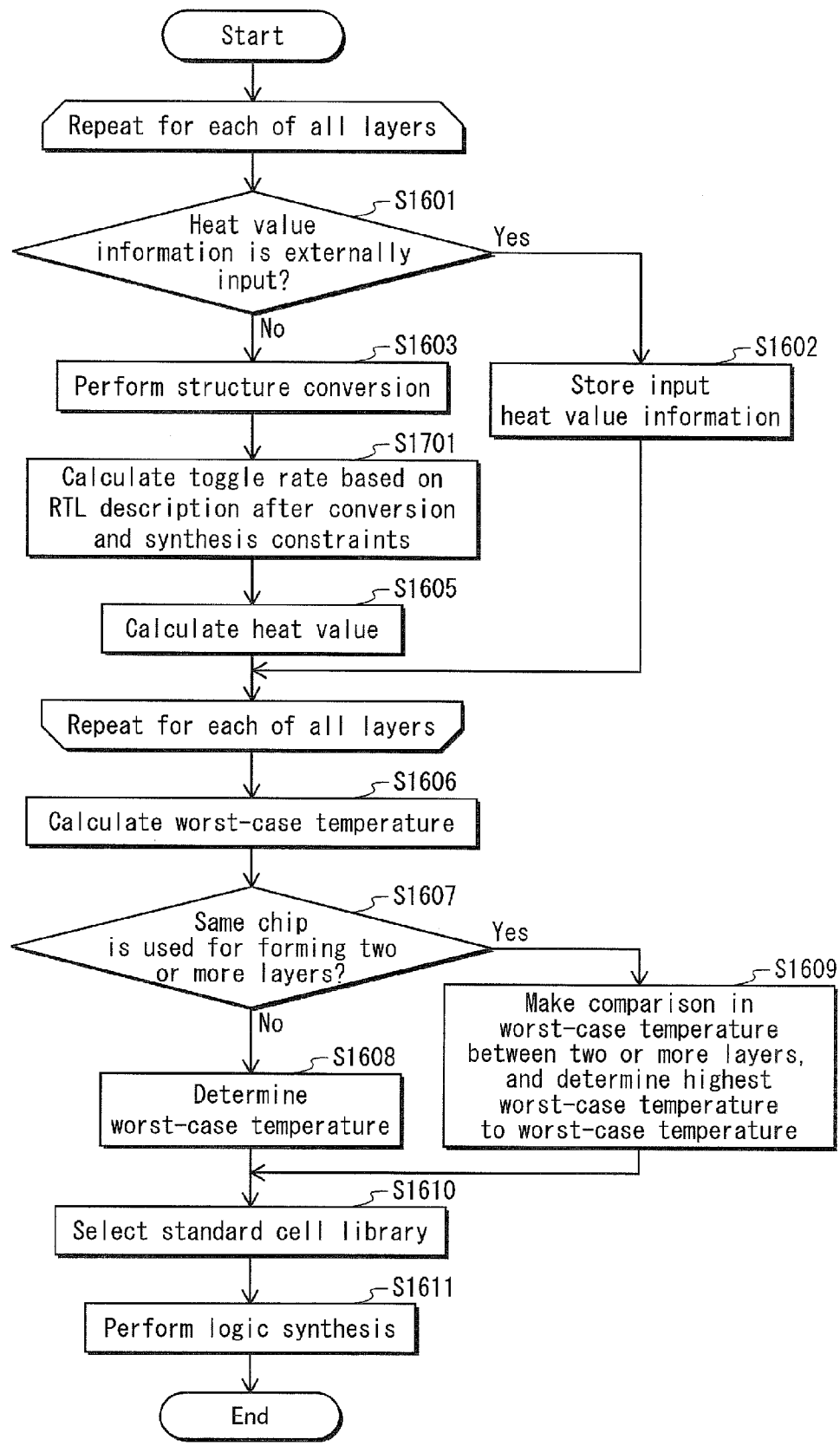
FIG. 17 is a flowchart showing operations of an integrated circuit design device relating to Embodiment 2.

FIG. 17 is a flowchart showing the operations of the integrated circuit design device relating to the Embodiment 2. Steps shown in FIG. 17 that are the same as those performed by the integrate circuit design device 200 relating to the Embodiment 1 shown in FIG. 16 have the same Step numbers and its explanation is omitted here. In the following, explanation is given mainly focusing on the heat value calculation processing (Steps S1603, S1701, and S1605).

The heat value calculation unit performs structure conversion by converting an RTL description into a gate-level circuit description (Step S1603). The structure conversion performed here is the same as that performed by the integrated circuit design device 200 relating to the Embodiment 1. After performing the processing in Step S1603, the heat value calculation unit calculates a toggle rate based on the gate-level circuit description, which results from converting the RTL description, and synthesis constraints (Step S1701). Specific explanation is given below on a method of calculating the toggle rate.

The toggle rate is represented by the frequency of operating signals×the gate utilization rate. In the present embodiment, the frequency of operating signals is set in accordance with the constraint conditions for logic synthesis. For example, under the synthesis constraints of a frequency of 200 MHz, the frequency of operating signals is set to 200 MHz. Also, the gate utilization rate is set based on the switching model that is empirically or statistically obtained. For example, in the case where the circuit designer empirically recognizes that a processor for broadcast streams operates at a utilization rate of approximately 70%, the gate utilization rate is set based on this utilization rate of the processor, which is empirically recognized. Alternatively, in the case where the circuit designer recognizes the statistical value of respective gate utilization rates of conventional similar types of chips, the gate utilization rate may be set based on the statistical value. Multiplication of the frequency of operating signals by the gate utilization rate, which are set in this way, results in the toggle rate. This completes the explanation on the method of calculating the toggle rate.

The heat value calculation unit calculates a heat value of each layer based on the toggle rate calculated in Step S1701 (Step S1605). The processing of calculating the heat value based on the toggle rate is the same as that performed by the integrated circuit design device 200 relating to the Embodiment 1.

Processing excepting this heat value calculation processing is the same as that performed by the integrated circuit design device 200 relating to the Embodiment 1, and accordingly its explanation is omitted here.

According to the present embodiment as explained above, it is possible to perform high-speed calculation of a heat value of each layer, without RTL simulations using an operation vector, thereby to set a worst-case temperature that is close to an actual operating temperature of each chip.

Embodiment 3

In the same way as the integrated circuit design device 200 relating to the Embodiment 1, in the logic synthesis phase, an integrated circuit design device relating to Embodiment 3 calculates a worst-case temperature of a chip forming each of layers constituting a three-dimensional integrated circuit to be designed based on a heat value of each layer, and selects a library for each layer based on the calculated worst-case temperature to perform logic synthesis on each layer. The integrated circuit design device relating to the Embodiment 3 differs from the integrated circuit design device 200 in method of calculating the heat value of each layer. The integrated circuit design device relating to the Embodiment 3 calculates the heat value of each layer, by referring to a predetermined heat value table with use of an RTL description, circuit type information indicating the circuit type of each module described in the RTL description, a circuit scale calculated for each module, and source voltage information indicating a source voltage to be supplied to each module. This enables high-speed calculation of the heat value of each layer, without RTL simulations using an operation vector. The following specifically explains the difference from the Embodiment 1 in heat value calculation processing.

The heat value calculation unit refers to the predetermined heat value table with use of the RTL description 301, the circuit type information, the circuit scale of each module, and the source voltage information 302 indicating a source voltage to be supplied to each module. As a result, the heat value calculation unit adds up the respective calculated heat values of the modules constituting each chip, thereby to calculate a heat value of the chip forming each layer. The RTL description 301, the circuit type information, and the source voltage information 302 are input by the circuit designer via the input unit 201. Also as explained in the Embodiment 1, the heat value calculation unit performs structure conversion by converting the RTL description 301 into a gate-level circuit description, and calculates the circuit scale of each module based on the gate-level circuit description, which results from converting the RTL description 301. The RTL description 301 and the source voltage information 302 have been already explained in the Embodiment 1. The following explanation is given on the circuit type information and the heat value table that are for use in calculating the heat value.

The circuit type information indicates the circuit type of each module described in the RTL description. The circuit type information is input by the circuit designer via the input unit 201. FIG. 18 shows an example of the circuit type information. As shown in FIG. 18, the circuit type information indicates the circuit type of each module described in the RTL description, such as a processor and a memory. For example, the circuit type of a module "mc_cpu" in the example shown in FIG. 18 is a CPU. This completes the explanation on the circuit type information. Next, explanation is given on the heat value table.

The heat value table indicates heat values corresponding to the circuit type, the circuit scale, and the source voltage. The heat value table is obtained as experimental or statistical data. Specifically, the heat value table is statistically created based on results of measurement on other types of chips, or created through circuit simulations. FIG. 19 shows an example of the heat value table. In the example shown in FIG. 19, a processor with a circuit scale of 100000 Tr. (the number of transistors) has a heat value of 100000. This completes the explanation on the heat value calculation processing. Next, the following explains the operations of the integrated circuit design device relating to the Embodiment 3, including the heat value calculation processing.

Figure 20:
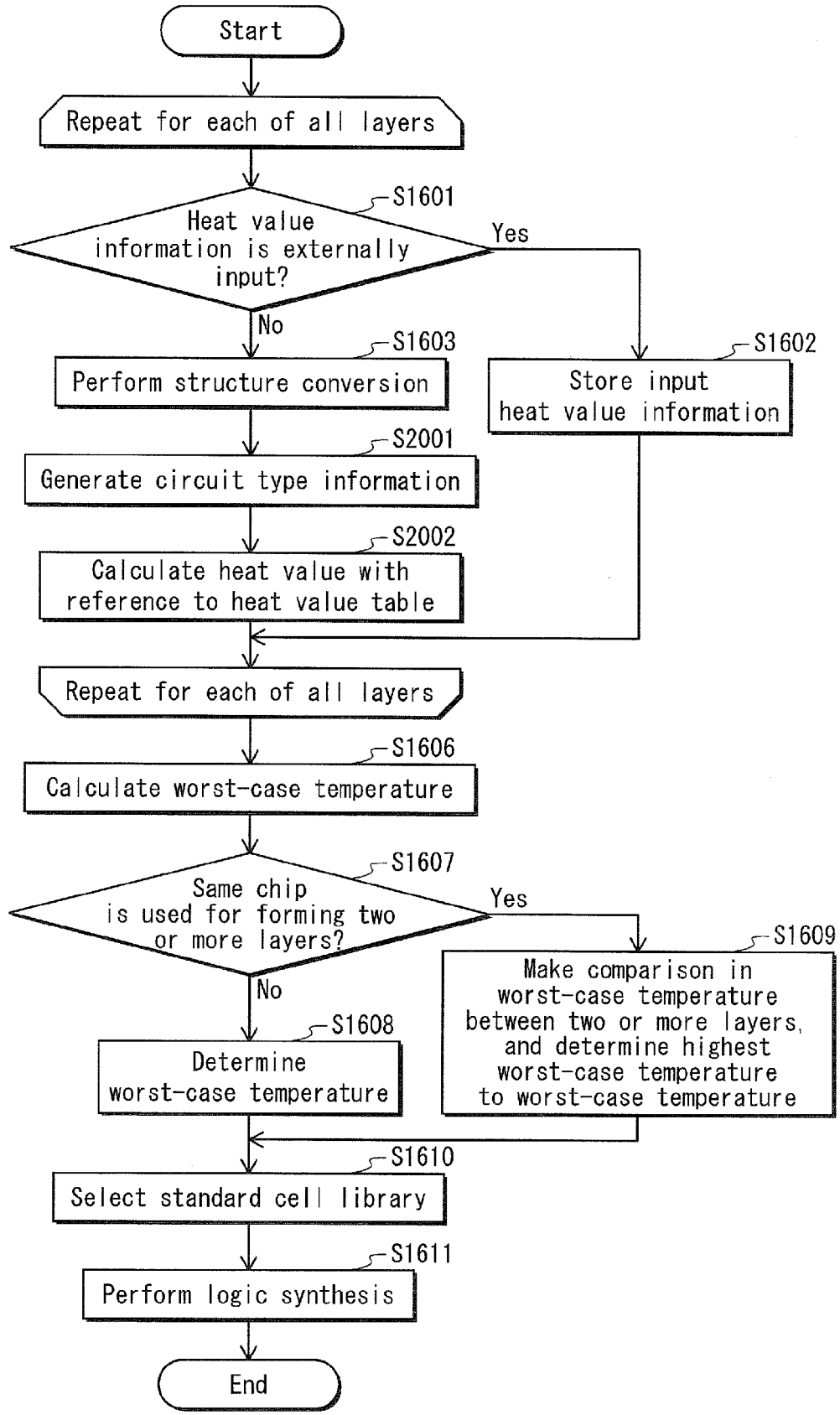
FIG. 20 is a flowchart showing operations of an integrated circuit design device relating to Embodiment 3.

FIG. 20 is a flowchart showing the operations of the integrated circuit design device relating to the Embodiment 3. Steps shown in FIG. 20 that are the same as those performed by the integrate circuit design device 200 relating to the Embodiment 1 shown in FIG. 16 have the same Step numbers and its explanation is omitted here. In the following, explanation is given mainly focusing on the heat value calculation processing (Steps S1603, S2001, and S2002).

The heat value calculation unit performs structure conversion by converting an RTL description into a gate-level circuit description (Step S1603). The structure conversion performed here is the same as that performed by the integrated circuit design device 200 relating to the Embodiment 1. After performing the processing in Step S1603, the heat value calculation unit generates circuit type information (Step S2001). Then, the heat value calculation unit calculates a heat value of each layer, by referring to the heat value table with use of the gate-level circuit description, which results from converting the RTL description, the circuit type information indicating the circuit type of each module described in the gate-level circuit description, the circuit scale calculated for each module, and the source voltage information indicating a source voltage to be supplied to each module (Step S2002).

Processing excepting this heat value calculation processing is the same as that performed by the integrated circuit design device 200 relating to the Embodiment 1, and accordingly its explanation is omitted here.

According to the present embodiment as explained above, it is possible to perform high-speed calculation of a heat value of each layer, without RTL simulations using an operation vector, thereby to set a worst-case temperature that is close to an actual operating temperature of each chip.

<Supplementary Explanations>

Although the present invention has been explained based on the above embodiments, the present invention is not of course limited to the above embodiments. The present invention may include the following modification examples.

(a) The present invention may be an application execution method indicated by the processing procedure explained in the above embodiments, or a computer program that includes program codes for controlling a computer in the accordance with the processing procedure.

(b) The present invention may be a package of an IC, an LSI, or other integrated circuit that performs application execution control. Various types of devices on which this package has been installed realize the functions explained in the above embodiments. Also, a method for circuit integration is not limited to an LSI, and may be realized by a dedicated circuit or a general processor. Furthermore, it may be possible to use an FPGA (Field Programmable Gate Array) programmable after manufacturing LSIs or a reconfigurable processor in which connection and setting of a circuit cell inside an LSI is reconfigurable after manufacturing LSIs. Furthermore, when a new technology for forming integrated circuits that replaces LSIs becomes available as a result of progress in semiconductor technology or semiconductor-derived technologies, functional blocks may be integrated using such a technology. One possibility lies in adaptation of biotechnology.

(c) In the Embodiments 1 and 2, respective heat values of respective chips forming layers are calculated by the Equation 1, based on the above electrical circuit model in which the thermal resistance and the heat flow have been replaced with the resistance and the current source, respectively. However, the present invention is not necessarily limited to this. Alternatively, other method may be employed for calculating the respective heat values forming the respective chips forming the layers. For example, simulation in accordance with the finite element method may be employed for calculating the respective heat values of the chips.

(d) In the Embodiments 1 and 2, the integrated circuit design device calculates a worst-case temperature of a chip forming each layer targeted for logic synthesis among layers constituting a three-dimensional integrated circuit to be designed, in consideration of respective heat values of respective chips forming all of the constituting layers. However, the present invention is not necessarily limited to this. Alternatively, the integrated circuit design device may calculate a worst-case temperature of a chip forming each of the target layers, in consideration of respective heat values of respective chips forming only some layers that sandwich the target layer.

(e) In the Embodiments 1 and 2, the RTL description 301 is input by the circuit designer. However, the present invention is not necessarily limited to this. Alternatively, the RTL description 301 may be resulted from performing an operation synthesis based on an operation description at a higher abstraction level than an RTL description.

(f) The present invention may be any combination of the above embodiments and modification examples.

An integrated circuit design device relating to the present invention is useful in designing a three-dimensional integrated circuit having a small performance margin in the logic synthesis phase. This is because the integrated circuit design device calculates a worst-case temperature of a chip forming each of one or more layers among layers constituting a three-dimensional integrated circuit to be designed, in consideration of respective heat values of respective chips forming the constituting layers and respective stack structures of the chips such as the thickness, and performs logic synthesis on each target layer with use of a library appropriate for the calculated worst-case temperature.

REFERENCE SIGNS LIST 200 integrated circuit design device
201 input unit
202 design information storage unit
203 heat value calculation unit
204 heat value information storage unit
205 stack structure information storage unit
206 worst-case temperature calculation unit
207 standard cell library storage unit
208 logic synthesis library selection unit
209 logic synthesis unit
301 RTL description
302 source voltage information
303 operation vector
304 synthesis constraints
801 thermal conductivity information
802 cooling information/usage environment temperature information
803 chip stack information

The invention claimed is:

1. An integrated circuit design device that designs a three-dimensional integrated circuit with use of a standard cell library, the standard cell library being composed of a plurality of libraries that are each appropriate for a different temperature, the integrated circuit design device comprising:
a temperature calculation unit operable to calculate, based on respective heat values and structure information pieces of respective chips forming layers constituting the three-dimensional integrated circuit to be designed, an operating temperature of a chip forming each of one or more target layers targeted for logic synthesis among the layers constituting the three-dimensional integrated circuit;
a standard cell library selection unit operable to, for each of the target layers, select one library among the libraries that is appropriate for an operating temperature that is closet to and higher than the operating temperature of the chip forming the target layer calculated by the temperature calculation unit; and
a logic synthesis unit operable to perform logic synthesis on each of the target layers with use of the library selected by the selection unit.

2. The integrated circuit design device of claim 1, further comprising a heat value calculation unit operable to calculate the respective heat values of the respective chips forming the layers constituting the three-dimensional integrated circuit.

3. The integrated circuit design device of claim 2, wherein the heat value calculation unit calculates, for each of the respective chips forming the layers constituting the three-dimensional integrated circuit, a toggle rate by analyzing the chip based on an RTL (Register Transfer Level) description of the chip and an operation vector of the chip that is an operation pattern that results in a highest power consumption, and calculates a power consumption of the chip based on the calculated toggle rate to thereby calculate the respective heat values of the respective chips forming the layers constituting the three-dimensional integrated circuit.

4. The integrated circuit design device of claim 2, wherein the heat value calculation unit calculates, for each of the respective chips forming the layers constituting the three-dimensional integrated circuit, a toggle rate by analyzing the chip based on an RTL (Register Transfer Level) description of the chip and constraint conditions for the logic synthesis, and calculates a power consumption of the chip based on the calculated toggle rate to thereby calculate the respective heat values of the respective chips forming the layers constituting the three-dimensional integrated circuit.

5. The integrated circuit design device of claim 2, wherein the heat value calculation unit calculates the respective heat values of the respective chips forming the layers constituting the three-dimensional integrated circuit, by, for each of the respective chips, analyzing the chip based on an RTL (Register Transfer Level) description of the chip to calculate a circuit scale of each of modules constituting the chip, and referring to a predetermined heat value table with use of the RTL description, the calculated circuit scale of the module, a circuit type of the module, and a source voltage to be supplied to the module.

6. The integrated circuit design device of claim 1, wherein with respect to one or more layers among the layers constituting the three-dimensional integrated circuit, the temperature calculation unit acquires, from a data sheet, respective heat values of respective chips forming the one or more layers.

7. The integrated circuit design device of claim 1, wherein the structure information pieces each indicate a thicknesses of a corresponding one of the respective chips forming the layers constituting the three-dimensional integrated circuit.

8. The integrated circuit design device of claim 1, wherein the structure information pieces each indicate a value of thermal conductivity of a corresponding one of the respective chips forming the layers constituting the three-dimensional integrated circuit.

9. The integrated circuit design device of claim 1, wherein with respect to each of the target layers, in the case where two or more layers including the target layer among the layers constituting the three-dimensional integrated circuit are formed by respective chips having the same circuit structure, the standard cell library selection unit makes a comparison between the two or more layers in operating temperature to select a standard library appropriate for the highest operating temperature resulting from the comparison.

10. The integrated circuit design device of claim 1, wherein the libraries each include a plurality of standard cells that differ in response duration from each other.

11. A method of designing a three-dimensional integrated circuit with use of a standard cell library, the standard cell library being composed of a plurality of libraries that are each appropriate for a different temperature, the method comprising:
using a computer to perform the steps of:
calculating, based on respective heat values and structure information pieces of respective chips forming layers constituting a three-dimensional integrated circuit to be designed, an operating temperature of a chip forming each of one or more target layers targeted for logic synthesis among the layers constituting the three-dimensional integrated circuit;
selecting, for each of the target layers, one library among the libraries that is appropriate for an operating temperature that is closet to and higher than the operating temperature of the chip forming the target layer calculated; and
performing logic synthesis on each of the target layers with use of the library selected.

12. A non-transitory computer-readable recording medium storing a program for causing a computer to perform a process of designing a three-dimensional integrated circuit with use of a standard cell library, the standard cell library being composed of a plurality of libraries that are each appropriate for a different temperature, the process comprising:
calculating, based on respective heat values and structure information pieces of respective chips forming layers constituting a three-dimensional integrated circuit to be designed, an operating temperature of a chip forming each of one or more target layers targeted for logic synthesis among the layers constituting the three-dimensional integrated circuit;
selecting, for each of the target layers, one library among the libraries that is appropriate for an operating temperature that is closet to and higher than the operating temperature of the chip forming the target layer calculated; and
performing logic synthesis on each of the target layers with use of the library selected.

* * * * *